United States Patent
Camacho et al.

(10) Patent No.: US 7,785,929 B2
(45) Date of Patent: Aug. 31, 2010

(54) MOUNTABLE INTEGRATED CIRCUIT PACKAGE SYSTEM WITH EXPOSED EXTERNAL INTERCONNECTS

(75) Inventors: Zigmund Ramirez Camacho, Singapore (SG); Abelardo Jr. Hadap Advincula, Singapore (SG); Henry Descalzo Bathan, Singapore (SG); Lionel Chien Hui Tay, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 228 days.

(21) Appl. No.: 12/054,682

(22) Filed: Mar. 25, 2008

(65) Prior Publication Data
US 2009/0243066 A1  Oct. 1, 2009

(51) Int. Cl.
  *H01L 21/44* (2006.01)
(52) U.S. Cl. ............. 438/112; 257/787; 257/E21.551
(58) Field of Classification Search ............. 257/686, 257/692, 696, 777, 787, E21.503, E21.551; 438/123, 124, 108, 112
See application file for complete search history.

(56) References Cited

U.S. PATENT DOCUMENTS

| | | | |
|---|---|---|---|
| 5,386,343 A | 1/1995 | Pao | |
| 5,412,538 A | 5/1995 | Kikinis et al. | |
| 6,498,389 B1 | 12/2002 | Kim | |
| 6,515,356 B1 | 2/2003 | Shin et al. | |
| 6,541,856 B2 | 4/2003 | Corisis et al. | |
| 6,777,798 B2 | 8/2004 | Fukumoto et al. | |
| 6,830,955 B2 | 12/2004 | Shin et al. | |
| 6,972,372 B1 * | 12/2005 | Tsai et al. | 174/551 |
| 6,982,488 B2 | 1/2006 | Shin et al. | |
| 7,151,013 B2 | 12/2006 | Corisis et al. | |
| 7,425,755 B2 * | 9/2008 | Liu | 257/666 |
| 2004/0108580 A1 | 6/2004 | Tan et al. | |
| 2009/0072412 A1 | 3/2009 | Camacho et al. | |
| 2009/0243067 A1 | 10/2009 | Camacho et al. | |

* cited by examiner

*Primary Examiner*—Quoc D Hoang
(74) *Attorney, Agent, or Firm*—Mikio Ishimaru

(57) ABSTRACT

The present invention provides a mountable integrated circuit package system comprising: providing an inner integrated circuit package including a first external interconnect having a shoulder; connecting an intraconnect between a second external interconnect and the shoulder; and forming an outer encapsulation over the inner integrated circuit package, the intraconnect, and partially exposing the first external interconnect on a top encapsulation side of the outer encapsulation and the second external interconnect on a bottom encapsulation side of the outer encapsulation.

20 Claims, 5 Drawing Sheets

MOUNTABLE INTEGRATED CIRCUIT PACKAGE SYSTEM WITH EXPOSED EXTERNAL INTERCONNECTS

CROSS-REFERENCE TO RELATED APPLICATION

The present application contains subject matter related to concurrently filed U.S. patent application Ser. No. 12/054,701. The related application is assigned to STATS ChipPAC Ltd.

TECHNICAL FIELD

The present invention relates generally to integrated circuit package system, and more particularly to integrated circuit package-in-package system.

BACKGROUND ART

Semiconductor package structures continue to advance toward miniaturization and thinning to increase the density of the components that are packaged and to decrease the sizes of the products made in implementation. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package.

An exemplary semiconductor package, well known in the electronics industry, is the quad flat package ("QFP"). QFP packages typically comprise a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

This increased integrated circuit density has led to the development of multi-chip packages, a package in package (PIP), a package on package (POP), or a combination thereof in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a substrate onto which a set of separate integrated circuit components are attached. Such multi-chip packages have been found to increase integrated circuit density and miniaturization, improve signal propagation speed, reduce overall integrated circuit size and weight, improve performance, and lower costs all of which are primary goals of the computer industry.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a mountable integrated circuit package system comprising: providing an inner integrated circuit package including a first external interconnect having a shoulder; connecting an intraconnect between a second external interconnect and the shoulder; and forming an outer encapsulation over the inner integrated circuit package, the intraconnect, and partially exposing the first external interconnect on a top encapsulation side of the outer encapsulation and the second external interconnect on a bottom encapsulation side of the outer encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
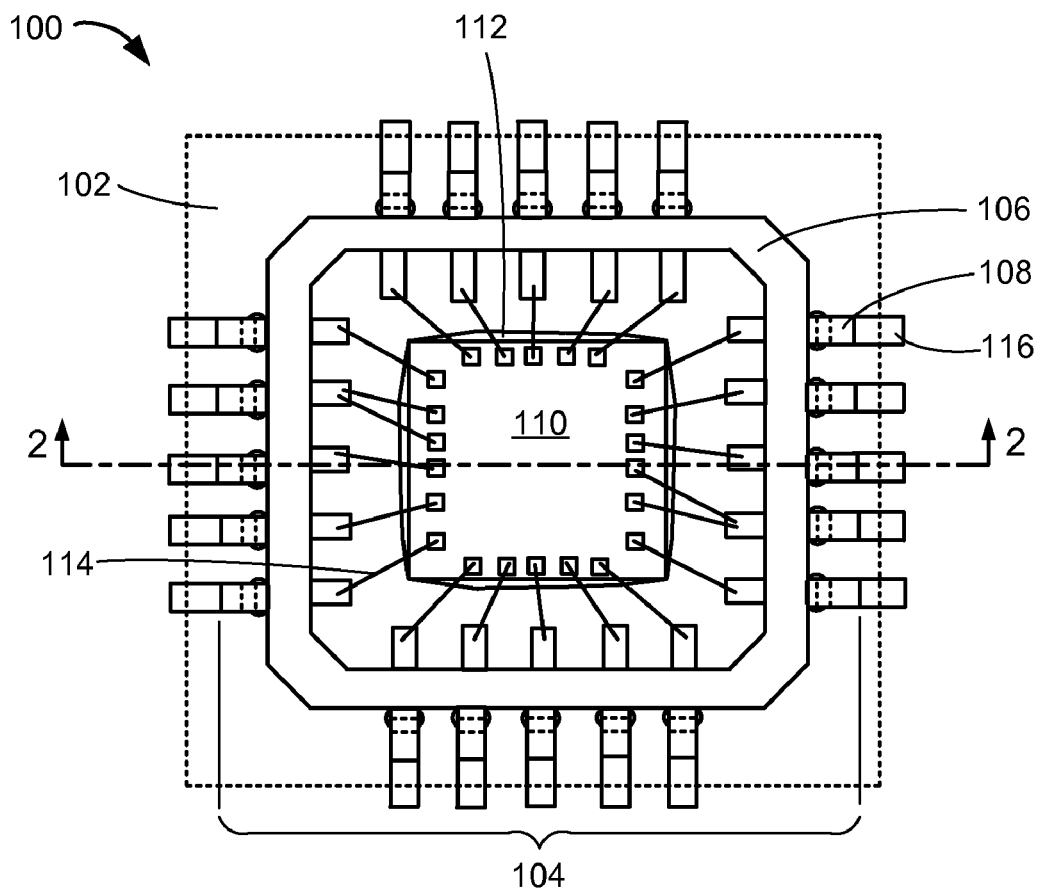
FIG. 1 is a top plan view without an outer encapsulation of a mountable integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing figures. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, or removal of the material or as required in forming a described structure. The term "system" as used herein means and refers to the method and to the apparatus of the present invention in accordance with the context in which the term is used.

Referring now to FIG. 1, therein is shown a top plan view of a mountable integrated circuit package system 100 without an outer encapsulation 102 as depicted by dotted lines in a first embodiment of the present invention. The top view depicts an inner integrated circuit package 104 having an inner encapsulation 106, such as of an epoxy molding compound, that partially exposes a first external interconnect 108.

A first stacking integrated circuit device 110, such as an integrated circuit die, that is optional is mounted over the inner integrated circuit package 104, such as with a first die-attach adhesive 112. A first inner interconnect 114, such as a bond wire or a ribbon bond, connects between the first stacking integrated circuit device 110 and the first external interconnect 108. A second external interconnect 116, such as from a singulated leadframe, is connected to the first external interconnect 108 to provide electrical connection between the first external interconnect 108 and the second external interconnect 116. Preferably, the second external interconnect 116 is distributed along the periphery of the mountable integrated circuit package system 100.

Figure 2:
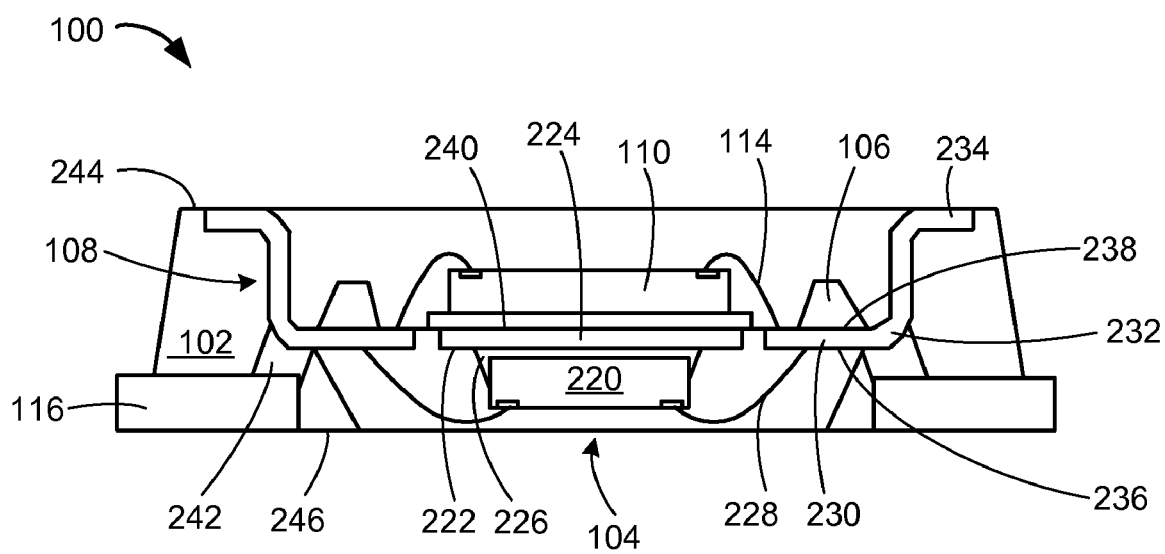
FIG. 2 is a cross-sectional view of the mountable integrated circuit package system along line 2-2 of FIG. 1.

Referring now to FIG. 2, therein is shown a cross-sectional view of the mountable integrated circuit package system 100 along line 2-2 of FIG. 1. The cross-sectional view depicts the inner integrated circuit package 104 comprising an inner integrated circuit device 220, such as an integrated circuit die, mounted to a first paddle side 222 of a die-attach paddle 224 with a second die-attach adhesive 226. A second inner interconnect 228, such as a bond wire, is connected between the inner integrated circuit device 220 and an inner tip 230 of the first external interconnect 108 to provide electrical connection between the inner integrated circuit device 220 and the first external interconnect 108. The first external interconnect 108 also includes a shoulder 232 and an outer tip 234, and the inner tip 230 further includes a first inner tip side 236 and a second inner tip side 238, opposing the first inner tip side 236. The second inner interconnect 228 is connected between the inner integrated circuit device 220 and the first inner tip side 236.

The inner encapsulation 106, such as of an epoxy molded compound, covers the first paddle side 222, the inner integrated circuit device 220, the second inner interconnect 228 and the first inner tip side 236. The inner encapsulation 106 partially exposes the first external interconnect 108, preferably partially exposing the second inner tip side 238. The inner encapsulation 106 also exposes the shoulder 232 and the outer tip 234 of the first external interconnect 108. The first stacking integrated circuit device 110 is mounted to a second paddle side 240 of the die-attach paddle 224 with the first inner interconnect 114 connected between the first stacking integrated circuit device 110 and the second inner tip side 238, exposed by the inner encapsulation 106.

An intraconnect 242 comprising a conductive material, such as a solder ball or a solder paste, preferably connects between the shoulder 232 and the second external interconnect 116. The intraconnect 242 provides routing of electrical connection between the first external interconnect 108, the second external interconnect 116, the inner integrated circuit device 220 and the first stacking integrated circuit device 110.

The outer encapsulation 102, such as of an epoxy molded compound, covers the inner integrated circuit package 104 and fully encloses the intraconnect 242, the first stacking integrated circuit device 110 and the first inner interconnect 114. The outer encapsulation 102 includes a top encapsulation side 244 and a bottom encapsulation side 246. The top encapsulation side 244 partially exposes the outer tip 234 and the bottom encapsulation side 246 partially exposing the second external interconnect 116 to provide electrical connection to the next system level. Preferably, the first external interconnect 108 is distributed along the periphery of the top encapsulation side 244, and the second external interconnect 116 is distributed along the periphery of the bottom encapsulation side 246.

It has been discovered that the present invention provides a mountable integrated circuit package system having a first external interconnect at a top encapsulation side and a second external interconnect at a bottom encapsulation side allowing inputs and outputs from an inner integrated circuit device to be routed to either the top encapsulation side or the bottom encapsulation side.

It has further been discovered that the mountable integrated circuit package system of this invention further reduces the package construction complexity by providing a first external interconnect at a top encapsulation side, such as a top terminal lead, while reducing costly wire bonding or signal-loss prone printed circuit board (PCB) means of re-routing electrical connections between integrated circuit devices. Moreover, the mountable integrated circuit package system also provides a structure for stacking additional integrated circuit devices over an inner integrated circuit device.

Figure 3:
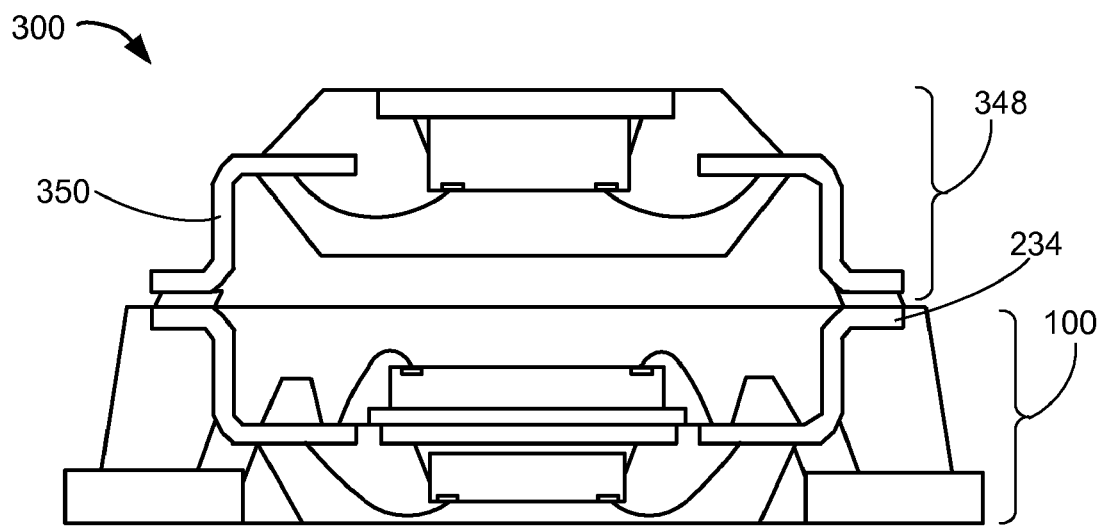
FIG. 3 is a cross-sectional view of the mountable integrated circuit package system of FIG. 2 with a stacking integrated circuit package in a second embodiment and an application of the present invention.

Referring now to FIG. 3, therein is shown a cross-sectional view of an integrated circuit package-on-package system 300 comprising the mountable integrated circuit package system 100 of FIG. 2 with a second stacking integrated circuit device 348, such as a packaged single or multi-stacked integrated circuit dice, in a second embodiment and an application of the present invention. The second stacking integrated circuit device 348 includes a third external interconnect 350 that connects to the outer tip 234 of the mountable integrated circuit package system 100, such as with solder paste or solder ball, to provides electrical connection between the second stacking integrated circuit device 348 and the mountable integrated circuit package system 100.

It has been discovered that providing both a first external interconnect and a second external interconnect at a top encapsulation side and a bottom encapsulation side allows flexibility and versatility in package-on-package stacking of integrated circuit packages.

Figure 4:
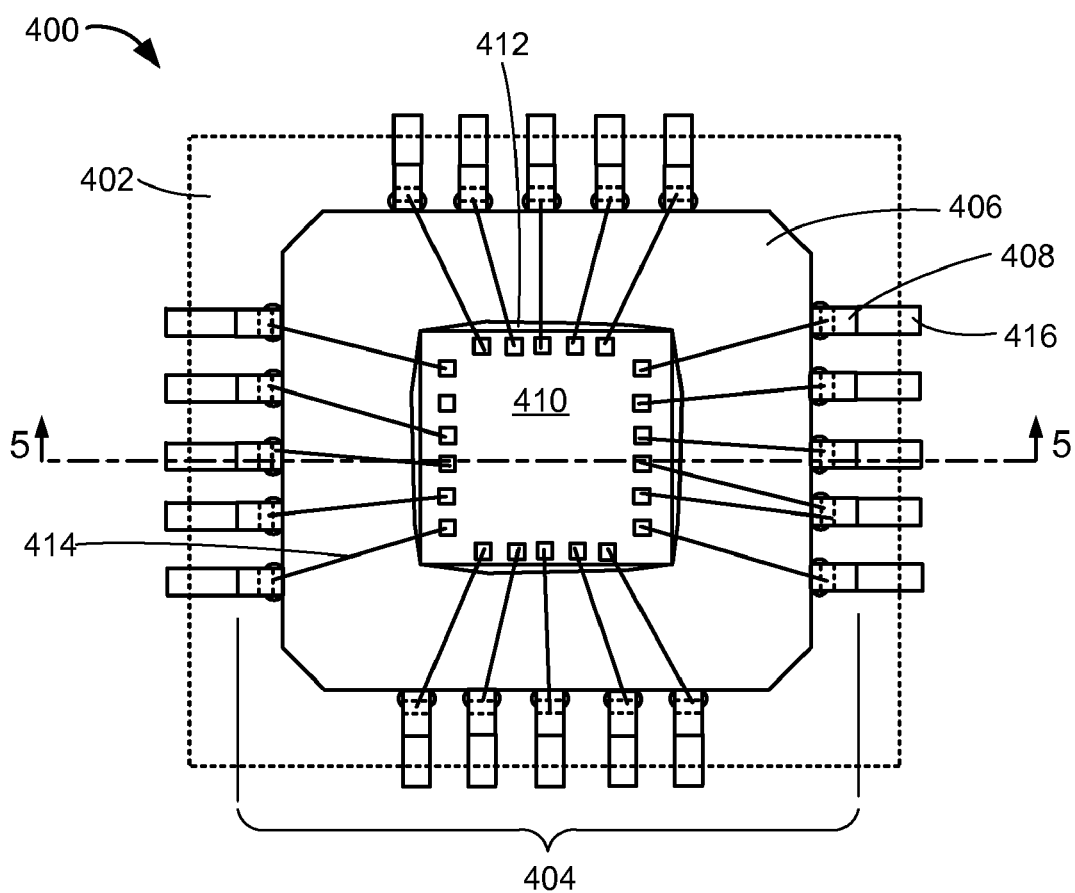
FIG. 4 is a top plan view without an outer encapsulation of a mountable integrated circuit package system in a third embodiment of the present invention.

Referring now to FIG. 4, therein is shown a top plan view of a mountable integrated circuit package system 400 without an outer encapsulation 402 indicated by dotted lines in a first embodiment of the present invention. The top view depicts an inner integrated circuit package 404 having an inner encapsulation 406, such as of an epoxy molded compound, that partially exposes a first external interconnect 408.

A first stacking integrated circuit device 410, such as an integrated circuit die, that is optional is mounted over the inner integrated circuit package 404, such as with a first die-attach adhesive 412. A first inner interconnect 414, such as a bond wire or a ribbon bond, connects between the first stacking integrated circuit device 410 and the first external interconnect 408. A second external interconnect 416, such as from a singulated leadframe, is connected to the first external interconnect 408 to provide electrical connection between the first external interconnect 408 and the second external interconnect 416. Preferably, the second external interconnect 416 is distributed along the periphery of the mountable integrated circuit package system 400.

Figure 5:
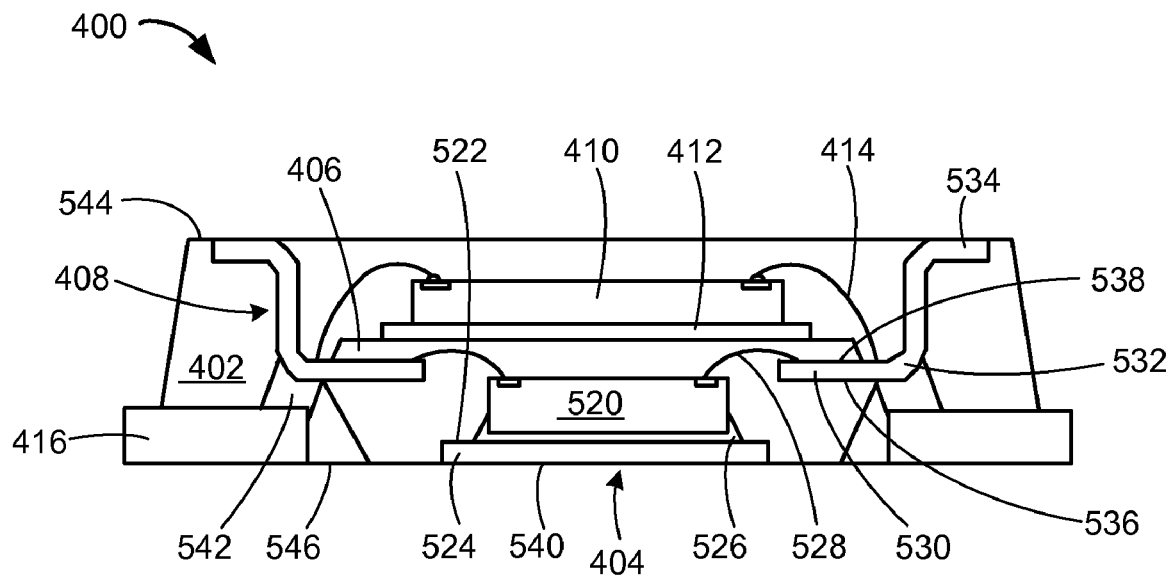
FIG. 5 is a cross-sectional view of the mountable integrated circuit package system along line 5-5 of FIG. 4.

Referring now to FIG. 5, therein is shown a cross-sectional view of the mountable integrated circuit package system 400 along line 5-5 of FIG. 4. The cross-sectional view depicts the inner integrated circuit package 404 comprising an inner integrated circuit device 520, such as an integrated circuit die, mounted to a first paddle side 522 of a die-attach paddle 524 with a second die-attach adhesive 526. A second inner interconnect 528, such as a bond wire, is connected between the inner integrated circuit device 520 and an inner tip 530 of the first external interconnect 408 to provide electrical connection between the inner integrated circuit device 520 and the first external interconnect 408. The first external interconnect 408 also includes a shoulder 532 and an outer tip 534, and the inner tip 530 further includes a first inner tip side 536 and a second inner tip side 538, opposing the first inner tip side 536. Preferably, the second inner interconnect 528 is connected between the inner integrated circuit device 520 and the second inner tip side 538.

The inner encapsulation 406 covers the first paddle side 522, the inner integrated circuit device 520, the second inner interconnect 528 and the inner tip 530. The inner encapsulation 406 partially exposes the first external interconnect 408, preferably partially exposing the shoulder 532 and the outer tip 534 of the first external interconnect 408. The inner encapsulation 406 partially exposes a second paddle side 540 of the die-attach paddle 524, preferably the second paddle side 540 is also coplanar to the second external interconnect 416. The first stacking integrated circuit device 410 is mounted over the inner encapsulation 406, such as with the first die-attach adhesive 412, with the first inner interconnect 414 connected between the first stacking integrated circuit device 410 and the shoulder 532 of the first external interconnect 408, exposed by the inner encapsulation 406.

An intraconnect 542 comprising a conductive material, such as a solder ball or a solder paste, connects between the shoulder 532 and the second external interconnect 416. The intraconnect 542 provides routing of electrical connection between the first external interconnect 408, the second external interconnect 416, the inner integrated circuit device 520 and the first stacking integrated circuit device 410.

Preferably, the outer encapsulation 402, such as of an epoxy molded compound, covers the inner integrated circuit package 404, the first stacking integrated circuit device 410 and the first inner interconnect 414. The outer encapsulation 402 includes a top encapsulation side 544 and a bottom encapsulation side 546. The top encapsulation side 544 partially exposes the outer tip 534 and the bottom encapsulation side 546 partially exposing the second external interconnect 416 to provide electrical connection to the next system level. Preferably, the first external interconnect 408 is distributed along the periphery of the top encapsulation side 544, and the second external interconnect 416 is distributed along the periphery of the bottom encapsulation side 546.

It has been discovered that the present invention provides a package-in-package system having a first external interconnect at a top encapsulation side and a second external interconnect at a bottom encapsulation side allowing inputs and outputs from an inner integrated circuit device and a first stacking integrated circuit device to be routed to either the top encapsulation side or the bottom encapsulation side.

It has further been discovered that the mountable integrated circuit package system of this invention further reduces the package construction complexity by providing a first external interconnect at a top encapsulation side, such as a top terminal lead, while reducing costly wire bonding or signal-loss prone printed circuit board (PCB) means of re-routing electrical connections between integrated circuit devices.

Figure 6:
FIG. 6 is a cross-sectional view of the structure of FIG. 5 in a forming phase of the intraconnect of the mountable integrated circuit package system of FIG. 2.

Referring now to FIG. 6, therein is shown a cross-sectional view of a forming phase of the intraconnect 242 of the mountable integrated circuit package system 100 of FIG. 2. The intraconnect 242 is formed over a leadframe 652.

Figure 7:
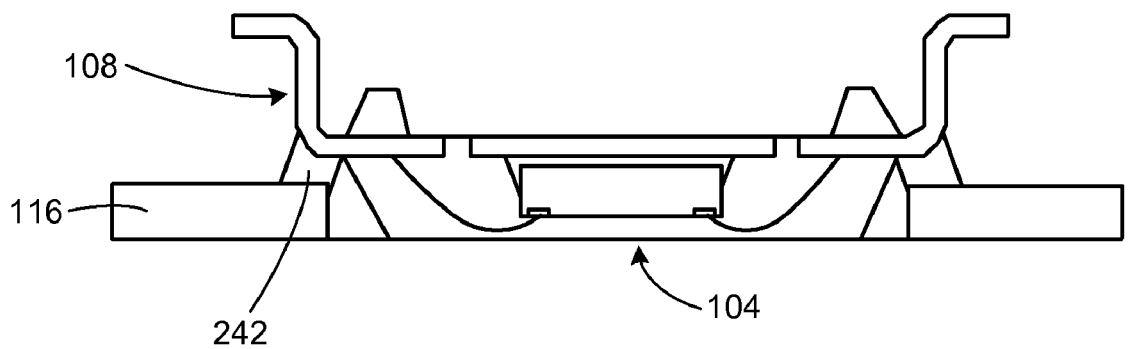
FIG. 7 is a cross-sectional view of the structure of FIG. 6 in a connecting phase of the first external interconnect of the mountable integrated circuit package system.

Referring now to FIG. 7, therein is shown a cross-sectional view of the structure of FIG. 6 in a connecting phase of the first external interconnect 108 of the inner integrated circuit package 104 and the second external interconnect 116. As described above, the intraconnect 242 comprising a conductive material, such as solder paste or solder ball, provides electrical connectivity between the first external interconnect 108 and the second external interconnect 116. The intraconnect 242 also provides electrical connection between the inner integrated circuit package 104 and the second external interconnect 116.

Figure 8:
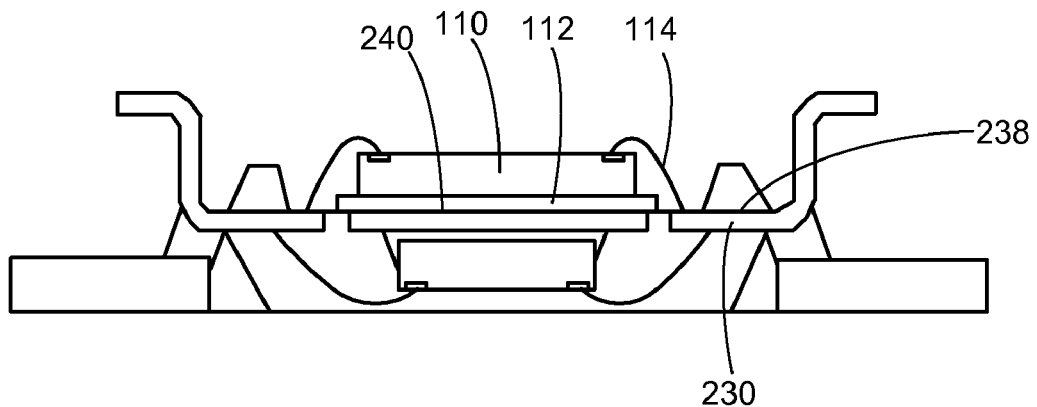
FIG. 8 is a cross-sectional view of the structure of FIG. 7 in a connecting phase of the first stacking integrated circuit device of the mountable integrated circuit package system.

Referring now to FIG. 8, therein is shown a cross-sectional view of the structure of FIG. 7 in a connecting phase of the first stacking integrated circuit device 110 and the inner tip 230. The first stacking integrated circuit device 110 is mounted to the second paddle side 240 with the first die-attach adhesive 112. The first inner interconnect 114 is connected between the first stacking integrated circuit device 110 and the second inner tip side 238.

Figure 9:
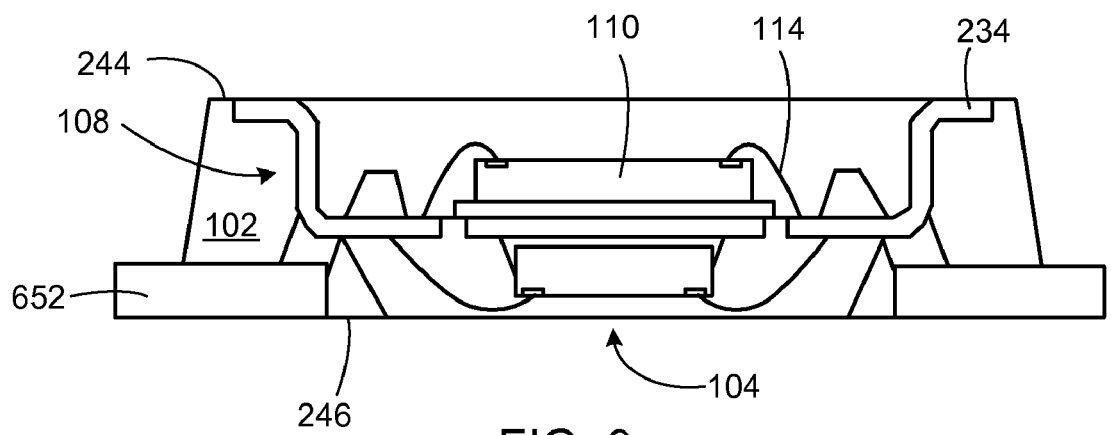
FIG. 9 is a cross-sectional view of the structure of FIG. 8 in a forming phase of the outer encapsulation of the mountable integrated circuit package system.

Referring now to FIG. 9, therein is shown a cross-sectional view of the structure of FIG. 8 in a forming phase of the outer encapsulation 102. The outer encapsulation 102 is formed over the inner integrated circuit package 104, the first inner interconnect 114, the first stacking integrated circuit device 110, and partially over the first external interconnect 108, partially exposing the outer tip 234 at the top encapsulation side 244, and partially exposing the leadframe 652 at the bottom encapsulation side 246.

Figure 10:
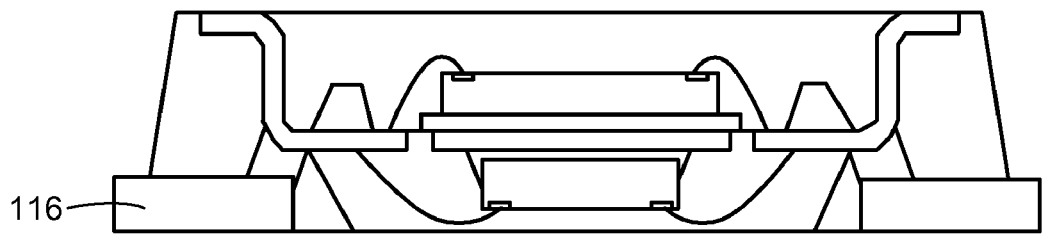
FIG. 10 is a cross-sectional view of the structure of FIG. 9 in a singulation phase of the mountable integrated circuit package system.

Referring now to FIG. 10, therein is shown a cross-sectional view of the structure of FIG. 9 in a singulation phase forming the second external interconnect 116 after singulating the leadframe 652 of FIG. 9.

Figure 11:
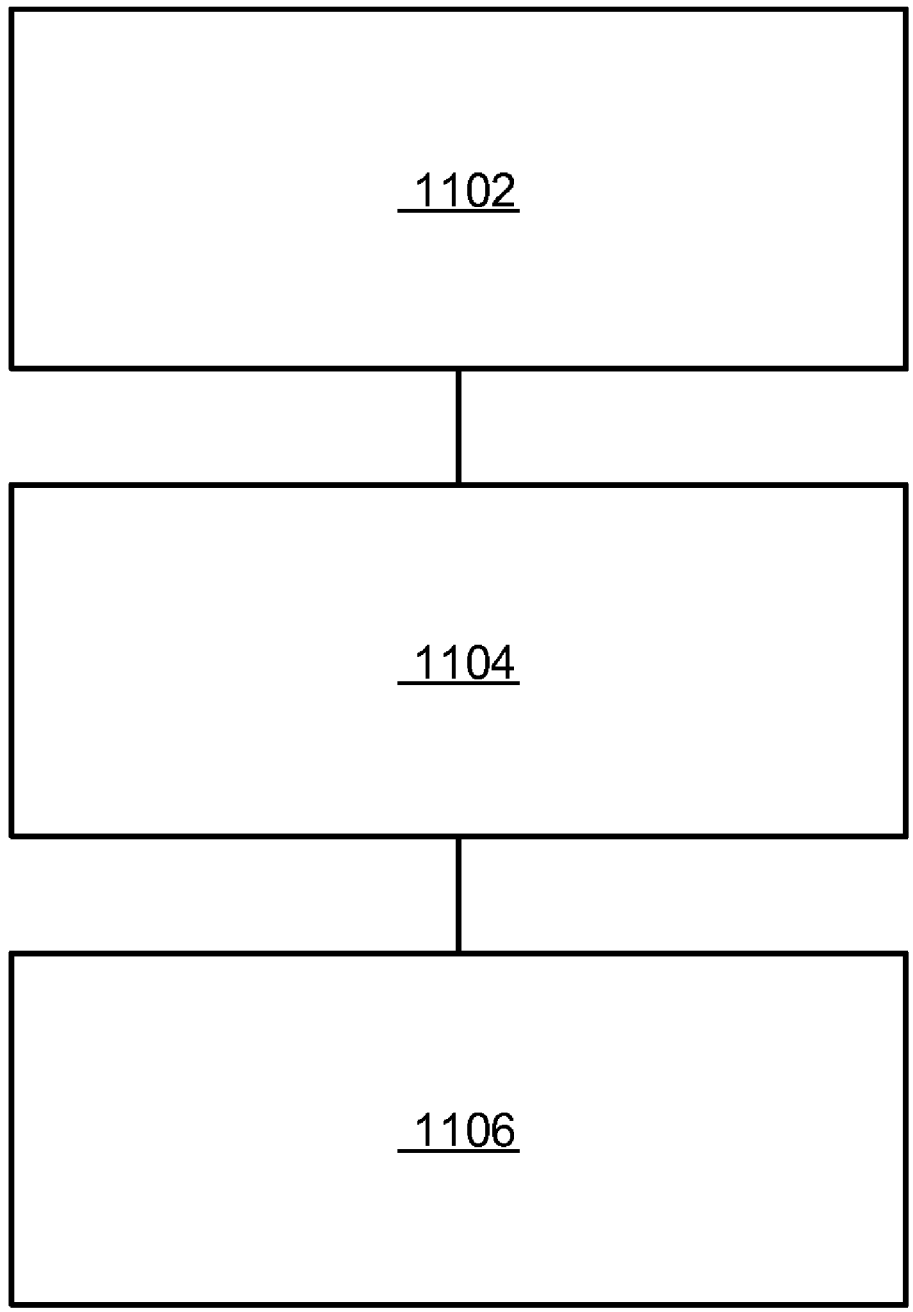
FIG. 11 is a flow chart of a mountable integrated circuit package system for manufacturing of the mountable integrated circuit package system in an embodiment of the present invention.

Referring now to FIG. 11, therein is shown a flow chart of an integrated circuit package system 1100 for manufacturing of the mountable integrated circuit package system of FIG. 1 in an embodiment of the present invention. The system 1100 comprises: providing an inner integrated circuit package including a first external interconnect having a shoulder in a block 1102; connecting an intraconnect between a second external interconnect and the shoulder in a block 1104; and forming an outer encapsulation over the inner integrated circuit package, the intraconnect, and partially exposing the first external interconnect on a top encapsulation side of the outer encapsulation and the second external interconnect on a bottom encapsulation side of the outer encapsulation in a block 1106.

It has further been discovered that the mountable integrated circuit package system of this invention further reduces the package construction complexity by providing a first external interconnect at a top encapsulation side, such as a top terminal lead, while reducing costly wire bonding or signal-loss prone printed circuit board (PCB) means of re-routing electrical connections between integrated circuit devices. Moreover, the mountable integrated circuit package system also provides a structure for stacking additional integrated circuit devices over an inner integrated circuit device.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the mountable integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a mountable integrated circuit package system comprising:
   providing an inner integrated circuit package including a first external interconnect having a shoulder;
   connecting an intraconnect between a second external interconnect and the shoulder; and
   forming an outer encapsulation over the inner integrated circuit package and fully enclosing the intraconnect, the outer encapsulation partially exposing the first external interconnect on a top encapsulation side of the outer encapsulation and the second external interconnect on a bottom encapsulation side of the outer encapsulation.

2. The method as claimed in claim 1 further comprising:
   mounting a first stacking integrated circuit device over the inner integrated circuit package; and
   connecting a first inner interconnect between the first stacking integrated circuit device and the first external interconnect.

3. The method as claimed in claim 1 wherein providing the inner integrated circuit package includes:
   forming an inner encapsulation over an inner integrated circuit device connected to the first external interconnect, the inner encapsulation exposing the shoulder and an outer tip of the first external interconnect, and partially exposing an inner tip of the first external interconnect.

4. The method as claimed in claim 1 further comprising mounting a second stacking integrated circuit device over the first external interconnect and the outer encapsulation.

5. The method as claimed in claim 1 wherein providing the inner integrated circuit package includes forming an inner encapsulation covering an inner integrated circuit device mounted over a die-attach paddle and the die-attach paddle exposed from the outer encapsulation.

6. A method for manufacturing a mountable integrated circuit package system comprising:
   providing an inner integrated circuit package having an inner integrated circuit device mounted to a die-attach paddle and connected to a first external interconnect having an inner tip, a shoulder, and an outer tip;
   connecting an intraconnect between a second external interconnect and the shoulder; and
   forming an outer encapsulation over the inner integrated circuit package and fully enclosing the intraconnect, the outer encapsulation partially exposing the outer tip on a top encapsulation side and the second external interconnect on a bottom encapsulation side.

7. The method as claimed in claim 6 further comprising:
   mounting a first stacking integrated circuit device over a second paddle side of the die-attach paddle; and
   connecting a first inner interconnect between the first stacking integrated circuit device and a second inner tip side of the inner tip.

8. The method as claimed in claim 6 wherein providing the inner integrated circuit package includes:
   mounting the inner integrated circuit device over a first paddle side of the die-attach paddle;
   connecting a second inner interconnect between the inner integrated circuit device and a first inner tip side of the inner tip; and
   forming an inner encapsulation over the inner integrated circuit device, the first paddle side, the second inner interconnect, the first inner tip side, and partially exposing a second inner tip side of the inner tip.

9. The method as claimed in claim 6 further comprising:
   mounting a first stacking integrated circuit device over the inner integrated circuit package; and
   connecting a first inner interconnect between the first stacking integrated circuit device and the shoulder.

10. The method as claimed in claim 6 wherein forming the outer encapsulation includes:

forming the outer encapsulation over the inner integrated circuit package;
partially exposing the outer tip at the top encapsulation side, the second external interconnect on the bottom encapsulation side; and
exposing a second paddle side of the die-attach paddle on the bottom encapsulation side.

11. A mountable integrated circuit package system comprising:
an inner integrated circuit package including a first external interconnect having a shoulder;
an intraconnect connected between a second external interconnect and the shoulder; and
an outer encapsulation formed over the inner integrated circuit package and fully enclosing the intraconnect, the outer encapsulation partially exposing the first external interconnect on a top encapsulation side of the outer encapsulation and the second external interconnect on a bottom encapsulation side of the outer encapsulation.

12. The system as claimed in claim 11 further comprising:
a first stacking integrated circuit device mounted over the inner integrated circuit package; and
a first inner interconnect connected between the first stacking integrated circuit device and the first external interconnect.

13. The system as claimed in claim 11 wherein the inner integrated circuit package includes:
an inner integrated circuit device connected to the first external interconnect; and
an inner encapsulation formed over the inner integrated circuit device, and exposing the shoulder and an outer tip of the first external interconnect, and partially exposing an inner tip of the first external interconnect.

14. The system as claimed in claim 11 further comprising a second stacking integrated circuit device mounted over the first external interconnect and the outer encapsulation.

15. The system as claimed in claim 11 wherein providing the inner integrated circuit package includes:
a die-attach paddle exposed from the outer encapsulation;
an inner integrated circuit device over the die-attach paddle; and
an inner encapsulation covering the inner integrated circuit device.

16. The system as claimed in claim 11 wherein the inner integrated circuit package includes the inner integrated circuit device mounted to a die-attach paddle and connected to the first external interconnect having an inner tip, the shoulder and an outer tip.

17. The system as claimed in claim 16 further comprising:
a first stacking integrated circuit device mounted to a second paddle side of the die-attach paddle; and
a first inner interconnect connected between the first stacking integrated circuit device and a second inner tip side of the inner tip.

18. The system as claimed in claim 16 wherein the inner integrated circuit package includes:
the inner integrated circuit device mounted to a first paddle side of the die-attach paddle;
a second inner interconnect connected between the inner integrated circuit device and a first inner tip side of the inner tip; and
an inner encapsulation formed over the inner integrated circuit device, the first paddle side, the second inner interconnect, the first inner tip side, and partially exposing a second inner tip side of the inner tip.

19. The system as claimed in claim 16 further comprising:
a first stacking integrated circuit device mounted over the inner integrated circuit package; and
a first inner interconnect connected between the first stacking integrated circuit device and the shoulder.

20. The system as claimed in claim 16 wherein the outer encapsulation includes the outer encapsulation formed over the inner integrated circuit package, partially exposing the outer tip at the top encapsulation side, the second external interconnect on the bottom encapsulation side, and exposing a second paddle side of the die-attach paddle on the bottom encapsulation side.

* * * * *